United States Patent
Cheung et al.

(10) Patent No.: US 8,721,797 B2
(45) Date of Patent: May 13, 2014

(54) ENHANCED PASSIVATION PROCESS TO PROTECT SILICON PRIOR TO HIGH DOSE IMPLANT STRIP

(75) Inventors: David Cheung, Foster City, CA (US); Haoquan Fang, Sunnyvale, CA (US); Jack Kuo, Pleasanton, CA (US); Ilia Kalinovski, Berkeley, CA (US); Ted Li, Sunnyvale, CA (US); Andrew Yao, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 162 days.

(21) Appl. No.: 12/963,503

(22) Filed: Dec. 8, 2010

(65) Prior Publication Data

US 2011/0139175 A1    Jun. 16, 2011

Related U.S. Application Data

(60) Provisional application No. 61/285,918, filed on Dec. 11, 2009.

(51) Int. Cl.
*B08B 7/00* (2006.01)

(52) U.S. Cl.
USPC .............................................. 134/1.2; 134/1.1

(58) Field of Classification Search
None
See application file for complete search history.

(56) References Cited

U.S. PATENT DOCUMENTS

| | | |
|---|---|---|
| 4,201,579 A | 5/1980 | Robinson et al. |
| 4,357,203 A | 11/1982 | Zelez |
| 4,699,689 A | 10/1987 | Bersin |
| 5,122,225 A | 6/1992 | Douglas |
| 5,158,644 A | 10/1992 | Cheung et al. |
| 5,292,393 A | 3/1994 | Maydan et al. |
| 5,354,386 A | 10/1994 | Cheung et al. |
| 5,593,541 A | 1/1997 | Wong et al. |
| 5,626,678 A | 5/1997 | Sahin et al. |
| 5,633,073 A | 5/1997 | Cheung et al. |
| 5,660,682 A | 8/1997 | Zhao et al. |
| 5,707,485 A | 1/1998 | Rolfson et al. |

(Continued)

FOREIGN PATENT DOCUMENTS

| | | |
|---|---|---|
| CN | 1402316 | 3/2003 |
| CN | 1720349 | 1/2006 |

(Continued)

OTHER PUBLICATIONS

Kikuchi et al., Native Oxide Removal on Si Surfaces by NF3-Added Hydrogen and Water Vapor Plasma Downstream Treatment, Jpn J. Appl. Phys. vol. 33 (1994), pp. 2207-2211, Part 1, No. 4B, Apr. 1994.

(Continued)

*Primary Examiner* — Nicole Blan
(74) *Attorney, Agent, or Firm* — Weaver Austin Villeneuve & Sampson LLP

(57) ABSTRACT

Improved methods and apparatus for stripping photoresist and removing ion implant related residues from a work piece surface are provided. According to various embodiments, the workpiece is exposed to a passivation plasma, allowed to cool for a period of time, and then exposed to an oxygen-based or hydrogen-based plasma to remove the photoresist and ion implant related residues. Aspects of the invention include reducing silicon loss, leaving little or no residue while maintaining an acceptable strip rate. In certain embodiments, methods and apparatus remove photoresist material after high-dose ion implantation processes.

13 Claims, 5 Drawing Sheets

(56) References Cited

U.S. PATENT DOCUMENTS

| | | | |
|---|---|---|---|
| 5,767,021 A | 6/1998 | Imai et al. | |
| 5,792,269 A | 8/1998 | Deacon et al. | |
| 5,811,358 A | 9/1998 | Tseng et al. | |
| 5,814,155 A | 9/1998 | Solis et al. | |
| 5,817,406 A | 10/1998 | Cheung et al. | |
| 5,820,685 A | 10/1998 | Kurihara et al. | |
| 5,830,775 A | 11/1998 | Maa et al. | |
| 5,844,195 A | 12/1998 | Fairbairn et al. | |
| 5,900,351 A | 5/1999 | Lutsic et al. | |
| 5,908,672 A | 6/1999 | Ryu et al. | |
| 5,911,834 A | 6/1999 | Fairbairn et al. | |
| 5,968,324 A | 10/1999 | Cheung et al. | |
| 5,980,770 A | 11/1999 | Ramachandran et al. | |
| 6,013,574 A | 1/2000 | Hause et al. | |
| 6,030,901 A | 2/2000 | Hopper et al. | |
| 6,039,834 A | 3/2000 | Tanaka et al. | |
| 6,045,618 A | 4/2000 | Raoux et al. | |
| 6,054,379 A | 4/2000 | Yau et al. | |
| 6,072,227 A | 6/2000 | Yau et al. | |
| 6,077,764 A | 6/2000 | Sugiarto et al. | |
| 6,083,852 A | 7/2000 | Cheung et al. | |
| 6,086,952 A | 7/2000 | Lang et al. | |
| 6,098,568 A | 8/2000 | Raoux et al. | |
| 6,107,184 A | 8/2000 | Mandal et al. | |
| 6,125,788 A | 10/2000 | Hills et al. | |
| 6,127,262 A | 10/2000 | Huang et al. | |
| 6,129,091 A | 10/2000 | Lee et al. | |
| 6,130,166 A | 10/2000 | Yeh | |
| 6,156,149 A | 12/2000 | Cheung et al. | |
| 6,162,323 A | 12/2000 | Koshimizu | |
| 6,171,945 B1 | 1/2001 | Mandal et al. | |
| 6,177,347 B1 | 1/2001 | Liu et al. | |
| 6,184,134 B1 | 2/2001 | Chaudhary et al. | |
| 6,187,072 B1 | 2/2001 | Cheung et al. | |
| 6,193,802 B1 | 2/2001 | Pang et al. | |
| 6,194,628 B1 | 2/2001 | Pang et al. | |
| 6,203,657 B1 | 3/2001 | Collison et al. | |
| 6,204,192 B1 | 3/2001 | Zhao et al. | |
| 6,209,484 B1 | 4/2001 | Huang et al. | |
| 6,230,652 B1 | 5/2001 | Tanaka et al. | |
| 6,242,350 B1 | 6/2001 | Tao et al. | |
| 6,245,690 B1 | 6/2001 | Yau et al. | |
| 6,277,733 B1 | 8/2001 | Smith | |
| 6,281,135 B1 | 8/2001 | Han et al. | |
| 6,287,990 B1 | 9/2001 | Cheung et al. | |
| 6,303,523 B2 | 10/2001 | Cheung et al. | |
| 6,306,564 B1 | 10/2001 | Mullee | |
| 6,319,842 B1 | 11/2001 | Khosla et al. | |
| 6,324,439 B1 | 11/2001 | Cheung et al. | |
| 6,340,435 B1 | 1/2002 | Bjorkman et al. | |
| 6,342,446 B1 | 1/2002 | Smith et al. | |
| 6,348,725 B2 | 2/2002 | Cheung et al. | |
| 6,350,701 B1 | 2/2002 | Yamazaki | |
| 6,358,573 B1 | 3/2002 | Raoux et al. | |
| 6,361,707 B1 | 3/2002 | Tanaka et al. | |
| 6,365,516 B1 | 4/2002 | Frenkel et al. | |
| 6,395,092 B1 | 5/2002 | Sugiarto et al. | |
| 6,413,583 B1 | 7/2002 | Moghadam et al. | |
| 6,426,304 B1 | 7/2002 | Chien et al. | |
| 6,432,830 B1* | 8/2002 | Merry | 438/706 |
| 6,448,187 B2 | 9/2002 | Yau et al. | |
| 6,465,964 B1 | 10/2002 | Taguchi et al. | |
| 6,511,903 B1 | 1/2003 | Yau et al. | |
| 6,511,909 B1 | 1/2003 | Yau et al. | |
| 6,517,913 B1 | 2/2003 | Cheung et al. | |
| 6,537,422 B2 | 3/2003 | Sakuma et al. | |
| 6,537,929 B1 | 3/2003 | Cheung et al. | |
| 6,541,282 B1 | 4/2003 | Cheung et al. | |
| 6,555,472 B2 | 4/2003 | Aminpur | |
| 6,562,544 B1 | 5/2003 | Cheung et al. | |
| 6,562,690 B1 | 5/2003 | Cheung et al. | |
| 6,569,257 B1 | 5/2003 | Nguyen et al. | |
| 6,593,247 B1 | 7/2003 | Huang et al. | |
| 6,596,655 B1 | 7/2003 | Cheung et al. | |
| 6,632,735 B2 | 10/2003 | Yau et al. | |
| 6,638,875 B2 | 10/2003 | Han et al. | |
| 6,656,832 B1 | 12/2003 | Pan et al. | |
| 6,660,656 B2 | 12/2003 | Cheung et al. | |
| 6,660,663 B1 | 12/2003 | Cheung et al. | |
| 6,663,715 B1 | 12/2003 | Yuda et al. | |
| 6,667,244 B1* | 12/2003 | Cox et al. | 438/712 |
| 6,669,858 B2 | 12/2003 | Bjorkman et al. | |
| 6,680,164 B2 | 1/2004 | Nguyen et al. | |
| 6,680,420 B2 | 1/2004 | Pang et al. | |
| 6,689,930 B1 | 2/2004 | Pang et al. | |
| 6,693,043 B1 | 2/2004 | Li et al. | |
| 6,709,715 B1 | 3/2004 | Lang et al. | |
| 6,720,132 B2 | 4/2004 | Tsai et al. | |
| 6,730,593 B2 | 5/2004 | Yau et al. | |
| 6,734,115 B2 | 5/2004 | Cheung et al. | |
| 6,743,737 B2 | 6/2004 | Yau et al. | |
| 6,764,940 B1 | 7/2004 | Rozbicki et al. | |
| 6,770,556 B2 | 8/2004 | Yau et al. | |
| 6,787,452 B2 | 9/2004 | Sudijono et al. | |
| 6,797,188 B1 | 9/2004 | Shen et al. | |
| 6,800,571 B2 | 10/2004 | Cheung et al. | |
| 6,806,207 B2 | 10/2004 | Huang et al. | |
| 6,837,967 B1 | 1/2005 | Berman et al. | |
| 6,848,455 B1 | 2/2005 | Shrinivasan et al. | |
| 6,858,153 B2 | 2/2005 | Bjorkman et al. | |
| 6,869,896 B2 | 3/2005 | Cheung et al. | |
| 6,900,135 B2 | 5/2005 | Somekh et al. | |
| 6,902,682 B2 | 6/2005 | Shang et al. | |
| 6,930,061 B2 | 8/2005 | Cheung et al. | |
| 7,023,092 B2 | 4/2006 | Yau et al. | |
| 7,070,657 B1 | 7/2006 | Cheung et al. | |
| 7,074,298 B2 | 7/2006 | Gondhalekar et al. | |
| 7,160,821 B2 | 1/2007 | Huang et al. | |
| 7,186,648 B1 | 3/2007 | Rozbicki et al. | |
| 7,202,176 B1 | 4/2007 | Goto et al. | |
| 7,205,249 B2 | 4/2007 | Cheung et al. | |
| 7,227,244 B2 | 6/2007 | Bjorkman et al. | |
| 7,256,134 B2 | 8/2007 | Kim et al. | |
| 7,288,484 B1 | 10/2007 | Goto et al. | |
| 7,297,635 B2 | 11/2007 | Toda et al. | |
| 7,344,993 B2 | 3/2008 | Balasubramaniam et al. | |
| 7,390,755 B1 | 6/2008 | Chen et al. | |
| 7,432,209 B2 | 10/2008 | Delgadino et al. | |
| 7,465,680 B2 | 12/2008 | Chen et al. | |
| 7,468,326 B2 | 12/2008 | Chen et al. | |
| 7,556,712 B2 | 7/2009 | Yi et al. | |
| 7,560,377 B2 | 7/2009 | Cheung et al. | |
| 7,569,492 B1 | 8/2009 | Chen et al. | |
| 7,585,777 B1 | 9/2009 | Goto et al. | |
| 7,595,005 B2 | 9/2009 | Balasubramaniam | |
| 7,597,816 B2 | 10/2009 | Chang et al. | |
| 7,601,272 B2 | 10/2009 | Nguyen et al. | |
| 7,628,864 B2 | 12/2009 | Moriya et al. | |
| 7,651,949 B2 | 1/2010 | Jo | |
| 7,740,768 B1 | 6/2010 | Goto et al. | |
| 8,034,176 B2 | 10/2011 | Tsukamoto et al. | |
| 8,058,178 B1 | 11/2011 | Goto et al. | |
| 8,058,181 B1 | 11/2011 | Chen et al. | |
| 8,097,527 B2 | 1/2012 | Yang | |
| 8,129,281 B1 | 3/2012 | Cheung et al. | |
| 8,193,096 B2 | 6/2012 | Goto et al. | |
| 8,435,895 B2 | 5/2013 | Chen et al. | |
| 8,444,869 B1 | 5/2013 | Goto et al. | |
| 8,591,661 B2 | 11/2013 | Cheung et al. | |
| 2001/0014529 A1 | 8/2001 | Chen et al. | |
| 2001/0027023 A1 | 10/2001 | Ishihara | |
| 2002/0000202 A1 | 1/2002 | Yuda et al. | |
| 2002/0005392 A1* | 1/2002 | Luo et al. | 216/67 |
| 2002/0039625 A1* | 4/2002 | Powell et al. | 427/569 |
| 2002/0045331 A1 | 4/2002 | Aminpur | |
| 2002/0072016 A1 | 6/2002 | Chen et al. | |
| 2002/0078976 A1 | 6/2002 | Nguyen | |
| 2002/0081854 A1 | 6/2002 | Morrow et al. | |
| 2002/0090827 A1 | 7/2002 | Yokoshima | |
| 2002/0111041 A1 | 8/2002 | Annapragada et al. | |
| 2002/0132486 A1 | 9/2002 | Williams et al. | |
| 2002/0139775 A1 | 10/2002 | Chang et al. | |
| 2002/0185151 A1 | 12/2002 | Qingyuan et al. | |
| 2002/0185226 A1 | 12/2002 | Lea et al. | |

(56) References Cited

U.S. PATENT DOCUMENTS

| | | | |
|---|---|---|---|
| 2002/0187643 A1 | 12/2002 | Gu et al. | |
| 2002/0197870 A1 | 12/2002 | Johnson | |
| 2003/0036284 A1 | 2/2003 | Chou et al. | |
| 2003/0045115 A1 | 3/2003 | Fang | |
| 2003/0045131 A1 | 3/2003 | Verbeke et al. | |
| 2004/0084412 A1 | 5/2004 | Waldfried et al. | |
| 2004/0237997 A1 | 12/2004 | Rui et al. | |
| 2004/0245091 A1 | 12/2004 | Karim et al. | |
| 2004/0248414 A1 | 12/2004 | Tsai et al. | |
| 2005/0079723 A1 | 4/2005 | Niimi et al. | |
| 2005/0106888 A1 | 5/2005 | Chiu et al. | |
| 2005/0158667 A1 | 7/2005 | Nguyen et al. | |
| 2005/0196967 A1 | 9/2005 | Savas et al. | |
| 2006/0046482 A1 | 3/2006 | Verhaverbeke | |
| 2006/0102197 A1 | 5/2006 | Chiang et al. | |
| 2006/0138399 A1 | 6/2006 | Itano et al. | |
| 2006/0154471 A1 | 7/2006 | Minami | |
| 2006/0163202 A1 | 7/2006 | Shimizu | |
| 2006/0182875 A1* | 8/2006 | Ose et al. | 427/58 |
| 2006/0191478 A1 | 8/2006 | Gondhalekar et al. | |
| 2006/0201623 A1 | 9/2006 | Yoo | |
| 2006/0289384 A1 | 12/2006 | Pavel et al. | |
| 2007/0037396 A1* | 2/2007 | Verhaverbeke | 438/689 |
| 2007/0040172 A1* | 2/2007 | Kawakami et al. | 257/59 |
| 2007/0068900 A1 | 3/2007 | Kim et al. | |
| 2007/0144673 A1 | 6/2007 | Yeom | |
| 2007/0173066 A1 | 7/2007 | Kokura et al. | |
| 2007/0178698 A1 | 8/2007 | Okita et al. | |
| 2007/0224826 A1 | 9/2007 | Delgadino et al. | |
| 2007/0235137 A1 | 10/2007 | Tsukamoto et al. | |
| 2007/0281491 A1 | 12/2007 | Kamp | |
| 2008/0026589 A1 | 1/2008 | Hubacek et al. | |
| 2008/0044995 A1 | 2/2008 | Kang et al. | |
| 2008/0102646 A1 | 5/2008 | Kawaguchi et al. | |
| 2008/0160729 A1* | 7/2008 | Krueger et al. | 438/514 |
| 2008/0248656 A1 | 10/2008 | Chen et al. | |
| 2008/0286697 A1* | 11/2008 | Verhaverbeke et al. | 430/322 |
| 2009/0053901 A1 | 2/2009 | Goto et al. | |
| 2009/0056875 A1 | 3/2009 | Goto et al. | |
| 2009/0061623 A1 | 3/2009 | Chang et al. | |
| 2009/0200268 A1 | 8/2009 | Tappan et al. | |
| 2009/0221148 A1 | 9/2009 | Udo et al. | |
| 2009/0277871 A1* | 11/2009 | Berry et al. | 216/37 |
| 2010/0015812 A1 | 1/2010 | Nishikawa | |
| 2010/0062591 A1 | 3/2010 | Lin et al. | |
| 2010/0216312 A1 | 8/2010 | Yamamoto et al. | |
| 2010/0308463 A1* | 12/2010 | Yu et al. | 257/753 |
| 2011/0006034 A1 | 1/2011 | Hilkene et al. | |
| 2011/0139175 A1 | 6/2011 | Cheung et al. | |
| 2011/0139176 A1 | 6/2011 | Cheung et al. | |
| 2011/0143548 A1 | 6/2011 | Cheung et al. | |
| 2012/0211473 A1 | 8/2012 | Goto et al. | |
| 2013/0048014 A1 | 2/2013 | Shaviv et al. | |
| 2013/0157465 A1 | 6/2013 | Chen et al. | |

FOREIGN PATENT DOCUMENTS

| | | |
|---|---|---|
| CN | 1868043 | 11/2006 |
| CN | 101015042 | 8/2007 |
| CN | 101131928 | 2/2008 |
| EP | 0 304 068 | 2/1989 |
| EP | 1 077 476 | 2/2001 |
| EP | 1081754 | 7/2001 |
| JP | 2001-308078 | 11/2001 |
| JP | 2003-264170 | 9/2003 |
| JP | 2007/019367 | 1/2007 |
| JP | 2007-53344 | 3/2007 |
| JP | 2007/266610 | 10/2007 |
| WO | WO 2004/051702 | 6/2004 |
| WO | WO 2005/017983 | 2/2005 |
| WO | WO 2006/028858 | 3/2006 |
| WO | 2011/071980 | 6/2011 |
| WO | 2011/072042 | 6/2011 |
| WO | 2011/072061 | 6/2011 |
| WO | WO 2012/018375 | 2/2012 |

OTHER PUBLICATIONS

Woody K. Chung, "Downstream Plasma Removal of Mobile Ion Impurity From $SIO_2$," Published Proceedings of the 8th International Plasma Processing Symposium, Fall 1990, 7 pages.

Woody K, Chung, "Low Damage, Downstream RF Plasma Ashing of High Energy, Heavily Doped Implanted Resists," Semicon Korea, Dec. 1989.

A. Kalnitsky and W. K. Chung, "Characterization and Optimization of a Single Wafer Downstream Plasma Stripper," Journal of the Electrochemical Society, vol. 135, No. 9, Sep. 1988, pp. 2338-2341.

Goto et al., "Enhanced Stripping of Low-K Films Using Downstream Gas Mixing," Novellus Systems, Inc., U.S. Appl. No. 10/890,653, filed Jul. 13, 2004.

U.S. Office Action for U.S. Appl. No. 10/890,653 mailed Jul. 27, 2005.

U.S. Final Office Action for U.S. Appl. No. 10/890,653 mailed Jan. 10, 2006.

U.S. Office Action for U.S. Appl. No. 10/890,653 mailed Jun. 26, 2006.

U.S. Office Action for U.S. Appl. No. 10/890,653 mailed Oct. 11, 2006.

U.S. Office Action for U.S. Appl. No. 10/890,653 mailed Apr. 5, 2007.

Notice of Allowance for U.S. Appl. No. 10/890,653 mailed Jun. 15, 2007.

Allowed Claims for U.S. Appl. No. 10/890,653.

Supplemental Notice of Allowance for U.S. Appl. No. 10/890,653 mailed Jul. 23, 2007.

Goto et al, "Enhanced Stripping of Low-K Films Using Downstream Gas Mixing," Novellus Systems, Inc., U.S. Appl. No. 11/011,273, filed Dec. 13, 2004.

Notice of Allowance for U.S. Appl. No. 11/011,273 mailed Nov. 28, 2006.

Allowed Claims for U.S. Appl. No. 11/011,273.

Goto et al, "Enhanced Stripping of Low-K Films Using Downstream Gas Mixing," Novellus Systems, Inc., U.S. Appl. No. 11/712,253, filed Feb. 27, 2007, pp. 1-28.

U.S. Office Action for U.S. Appl. No. 11/712,253 mailed Dec. 23, 2008.

Goto, et al., "Photoresist Strip Method for Low-K Dielectrics," U.S. Appl. No. 11/859,727, filed Sep. 21, 2007.

U.S. Office Action for U.S. Appl. No. 11/859,727 mailed Oct. 6, 2008.

Notice of Allowance for U.S. Appl. No. 11/859,727 mailed May 1, 2009.

Allowed Claims for U.S. Appl. No. 11/859,727.

Goto, et al., "High Dose Implantation Strip (HDIS) in H2 Base Chemistry," Novellus Systems, Inc., U.S. Appl. No. 12/251,305, filed Oct. 14, 2008.

Goto, et al., "Photoresist Strip Method for Low-K Dielectrics," U.S. Appl. No. 12/533,461, filed Jul. 31, 2009.

U.S. Office Action for U.S. Appl. No. 11/712,253 mailed Jul. 17, 2009.

Chen, et al., "Method for Post-Etch Cleans," U.S. Appl. No. 10/137,096, May 1, 2002.

U.S. Office Action for U.S. Appl. No. 10/137,096 mailed Jul. 11, 2003.

U.S. Final Office Action for U.S. Appl. No. 10/137,096 mailed Jul. 27, 2007.

Notice of Allowance for U.S. Appl. No. 10/137,096 mailed Jan. 15, 2008.

Allowed Claims for U.S. Appl. No. 10/137,096.

Chen, et al., "Method for Post-Etch Cleans," U.S. Appl. No. 12/111,095, filed Aug. 28, 2008.

U.S. Office Action for U.S. Appl. No. 12/111,095 mailed Aug. 25, 2008.

Notice of Allowance for U.S. Appl. No. 12/111,095 mailed Apr. 3, 2009.

(56) References Cited

OTHER PUBLICATIONS

Allowed Claims for U.S. Appl. No. 12/111,095.
Chen, et al., "Method for Post-Etch Cleans," U.S. Appl. No. 12/502,130, filed Jul. 31, 2009.
U.S. Office Action for U.S. Appl. No. 11/712,253 mailed Jan. 29, 2010.
Notice of Allowance for U.S. Appl. No. 11/548,801 mailed Feb. 17, 2010.
Cheung, et al., "Plasma Based Photoresist Removal System for Cleaning Post Ash Residue," U.S. Appl. No. 11/128,930, filed May 12, 2005.
U.S. Office Action for U.S. Appl. No. 11/128,930 mailed Sep. 13, 2006.
U.S. Final Office Action for U.S. Appl. No. 11/128,930 mailed Mar. 8, 2007.
U.S. Office Action for U.S. Appl. No. 11/128,930 mailed Mar. 19, 2007.
U.S. Office Action for U.S. Appl. No. 11/128,930 mailed Jun. 29, 2007.
U.S. Office Action for U.S. Appl. No. 11/128,930 mailed Dec. 10, 2007.
U.S. Final Office Action for U.S. Appl. No. 11/128,930 mailed Jul. 21, 2008.
U.S. Office Action for U.S. Appl. No. 11/128,930 mailed Mar. 20, 2009.
U.S. Office Action for U.S. Appl. No. 11/128,930 mailed Sep. 17, 2009.
U.S. Office Action for U.S. Appl. No. 11/128,930 mailed Feb. 26, 2010.
U.S. Final Office Action for U.S. Appl. No. 11/128,930 mailed Sep. 9, 2010.
S. Wolf and R.N. Tauber, (Silicon Processing for the VLSI Era, vol. 1—Process Technology, Lattice Press, 1986), pp. 539-543.
U.S. Office Action for U.S. Appl. No. 12/533,461 mailed Nov. 5, 2010.
U.S. Office Action for U.S. Appl. No. 12/502,130 mailed Dec. 8, 2010.
Cheung, et al. "Ultra Low Silicon Loss High Dose Implant Strip," U.S. Appl. No. 12/636,582, filed Dec. 11, 2009.
Cheung, et al. "Low Damage Photoresist Strip Method for Low-K Dielectrics," U.S. Appl. No. 12/636,601, filed Dec. 11, 2009.
U.S. Office Action for U.S. Appl. No. 11/712,253 mailed Mar. 1, 2011.
U.S. Office Action for U.S. Appl. No. 12/251,305 mailed Nov. 2, 2011.
U.S. Office Action for U.S. Appl. No. 12/786,230 mailed Nov. 10, 2011.
Notice of Allowance for U.S. Appl. No. 11/128,930 mailed Oct. 28, 2011.
Chen, et al., "Methods for Stripping Photoresist and/or Cleaning Metal Regions," U.S. Appl. No. 11/696,633, filed Apr. 7, 2007.
Office Action mailed Dec. 15, 2009, for U.S. Appl. No. 11/696,633.
Office Action mailed May 26, 2010, for U.S. Appl. No. 11/696,633.
Final Office Action mailed Sep. 20, 2010, for U.S. Appl. No. 11/696,633.
Office Action mailed Jun. 6, 2011, for U.S. Appl. No. 11/696,633.
Final Office Action mailed Sep. 28, 2011, for U.S. Appl. No. 11/696,633.
Office Action mailed Jan. 27, 2012, for U.S. Appl. No. 11/696,633.
Notice of Allowance for U.S. Appl. No. 12/251,305 mailed Feb. 17, 2012.
U.S. Final Office Action for U.S. Appl. No. 12/786,230 mailed Apr. 26, 2012.
Singapore Written Opinion and Search Report mailed Feb. 2, 2012, for Application No. 201104086-2.
Office Action mailed Mar. 30, 2012, for U.S. Appl. No. 12/636,601.
Goto, et al., "High Dose Implantation Strip (HDIS) in H2 Base Chemistry," Novellus Systems, Inc., U.S. Appl. No. 13/462,660, filed May 2, 2012.
Final Office Action mailed May 15, 2012, for U.S. Appl. No. 11/696,633.
Goto et al, "Enhanced Stripping of Low-K Films Using Downstream Gas Mixing," Novellus Systems, Inc., U.S. Appl. No. 10/890,653, filed Jul. 13, 2004.
Goto, et al., "High Dose Implantation Strip (HDTS) in H2 Base Chemistry," Novellus Systems, Inc., U.S. Appl. No. 12/251,305, filed Oct. 14, 2008.
Cheung, et al. "Enhanced Passivation Process to Protect Silicon Prior to High Dose Implant Strip," U.S. Appl. No. 12/963,503, filed Dec. 8, 2009.
U.S. Office Action for U.S. Appl. No. 11/128,930 mailed May 10, 2011.
U.S. Final Office Action for U.S. Appl. No. 12/533,461 mailed May 26, 2011.
International Search Report and Written Opinion for Application No. PCT/US2010/059388 mailed Jun. 27, 2011.
International Search Report and Written Opinion for Application No. PCT/US2010/059547 mailed Jul. 13, 2011.
International Search Report and Written Opinion for Application No. PCT/US2010/059517 mailed Jul. 14, 2011.
Notice of Allowance for U.S. Appl. No. 12/533,461 mailed Aug. 12, 2011.
Allowed Claims as of Aug. 12, 2011 for U.S. Appl. No. 12/533,461.
Notice of Allowance for U.S. Appl. No. 12/502,130 mailed Aug. 12, 2011.
Allowed Claims as of Aug. 12, 2011 for U.S. Appl. No. 12/502,130.
U.S. Appl. No. 12/786,230, filed May 24, 2010, entitled "Simultaneous Front Side Ash and Backside Clean".
U.S. Appl. No. 12/963,503, filed Dec. 8, 2010, entitled "Enhanced Passivation Process to Protect Silicon Prior to High Dose Implant Strip".
U.S. Appl. No. 13/274,638, filed Oct. 17, 2011, entitled "Photoresist Strip Method for Low-K Dielectrics."
U.S. Appl. No. 13/370,689, filed Feb. 10, 2012, entitled "Plasma Based Photoresist Removal System for Cleaning Post Ash Residue".
U.S. Appl. No. 13/590,083, filed Aug. 20, 2012, entitled "Photoresist Strip Processes for Improved Device Integrity".
US Office Action, dated Sep. 6, 2012, issued in U.S. Appl. No. 12/636,582.
US Final Office Action, dated Sep. 5, 2012, issued in U.S. Appl. No. 12/636,601.
US Final Office Action, dated May 15, 2012, issued in U.S. Appl. No. 11/696,633.
Notice of Allowance, dated Oct. 29, 2012, issued in U.S. Appl. No. 11/696,633.
Singapore Written Opinion, dated Feb. 2, 2012, issued in Application No. 201104086-2.
Singapore Second Written Opinion, dated Aug. 17, 2012, issued in Application No. 201104086-2.
Japanese Office Action mailed Sep. 25, 2012, issued in Application No. 2009-018046.
Chinese Office Action mailed Jul. 20, 2012, issued in Application No. 200810187894.4.
U.S. Appl. No. 14/066,587, filed Oct. 29, 2013, entitled "Low Damage Photoresist Strip Method for Low-K Dielectrics."
US Office Action dated Feb. 15, 2013, U.S. Appl. No. 13/274,638.
US Office Action, dated Apr. 26, 2013, issued in U.S. Appl. No. 13/462,660.
US Notice of Allowance, dated Sep. 30, 2013, issued in U.S. Appl. No. 13/462,660.
US Final Office Action, dated May 13, 2013, issued in U.S. Appl. No. 12/636,582.
US Office Action, dated Feb. 12, 2013, issued in U.S. Appl. No. 12/636,601.
US Notice of Allowance, dated Jul. 23, 2013, issued in U.S. Appl. No. 12/636,601.

(56) References Cited

OTHER PUBLICATIONS

US Notice of Allowance dated Jan. 24, 2013, issued in U.S. Appl. No. 12/786,230.
US Office Action dated Feb. 22, 2013, issued in U.S. Appl. No. 13/370,689.
US Final Office Action dated Aug. 20, 2013, issued in U.S. Appl. No. 13/370,689.
US Office Action, dated Jul. 19, 2013, issued in U.S. Appl. No. 13/759,958.
US Final Office Action, dated Nov. 12, 2013, issued in U.S. Appl. No. 13/759,958.
Chinese Office Action dated Jun. 19, 2013, issued in Application No. 200810187894.4.
Japanese Description of details of Reasons for Rejection dated Oct. 9, 2012, issued in Application No. 2009-018046.
Japanese Summary of Reasons for Rejection dated Sep. 3, 2013, issued in Application No. 2009-018046.
PCT International Preliminary Report on Patentability and Written Opinion, dated Jun. 21, 2012, issued in Application No. PCT/US2010/059388.
PCT International Preliminary Report on Patentability and Written Opinion, dated Jun. 21, 2012, issued in Application No. PCT/US2010/059517.
Singapore Written Opinion, dated Jul. 15, 2013, issued in Application No. 201204092-9.
PCT International Preliminary Report on Patentability and Written Opinion, dated Jun. 21, 2012, issued in Application No. PCT/US2010/059547.
Singapore Office Action dated Aug. 1, 2013 issued in Applivcation No. 201203361-9.
European Partial Search Report dated Apr. 17, 2013 issued in Application No. 12 18 1659.
European Partial Search Report dated Aug. 19, 2013 issued in Application No. 12 18 1659.
Ghandhi, Sorab K., (1983) "VLSI Fabrication Principles," by John wiley & Sons, Inc., pp. 517-520.

* cited by examiner

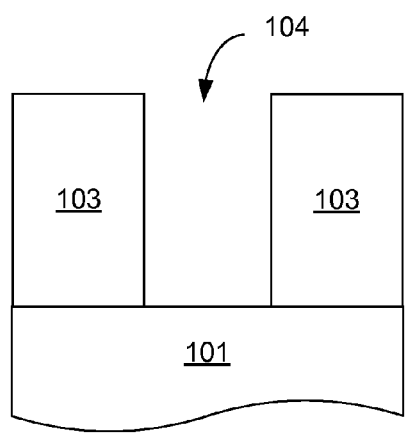
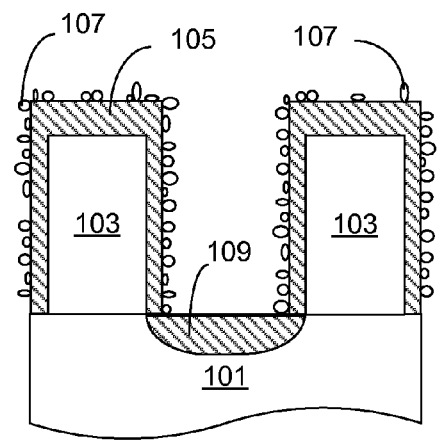
FIG. 1A  FIG. 1B
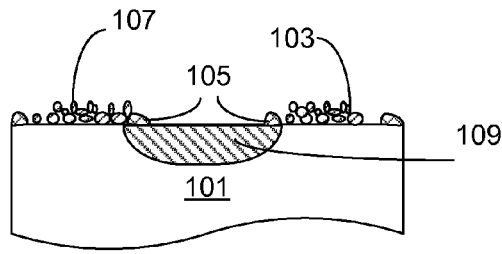
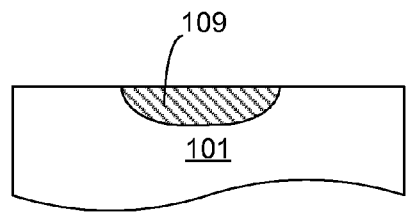
FIG. 1C  FIG. 1D

ENHANCED PASSIVATION PROCESS TO PROTECT SILICON PRIOR TO HIGH DOSE IMPLANT STRIP

CROSS-REFERENCE TO RELATED APPLICATIONS

This applications claims benefit under 34 USC §119(e) to U.S. Provisional Patent Application No. 61/285,918, filed Dec. 11, 2009, which is incorporated by reference herein.

FIELD OF INVENTION

The present invention pertains to methods and apparatuses to remove or strip photoresist material and removing related residues from a work piece surface. In certain embodiments, this application relates to methods and apparatus for stripping resist after ion implant or plasma assisting doping implant (low dose or high-dose implanted resist).

BACKGROUND

Photoresist is a light sensitive material used in certain fabrication processes to form a patterned coating on a work piece, e.g., a semiconductor wafer, during processing. After exposing the photoresist coated surface to a pattern of high energy radiation, a portion of the photoresist is removed to reveal the surface below, leaving the rest of the surface protected. Semiconductor processes such as etching, depositing, and ion implanting are performed on the uncovered surface and the remaining photoresist. After performing one or more semiconductor processes, the remaining photoresist is removed in a strip operation.

SUMMARY OF THE INVENTION

Improved methods and apparatus for stripping photoresist and removing ion implant related residues from a work piece surface are provided. According to various embodiments, the workpiece is exposed to a passivation plasma, allowed to cool for a period of time, and then exposed to an oxygen-based or hydrogen-based plasma to remove the photoresist and ion implant related residues. Aspects of the invention include reducing silicon loss, leaving little or no residue while maintaining an acceptable strip rate. In certain embodiments, methods and apparatus remove photoresist material after high-dose ion implantation processes.

One aspect of the invention relates to a method of removing material from a work piece surface in a reaction chamber, and involves exposing the work piece to a plasma generated from forming gas; after exposing the work piece to the forming gas plasma, allowing the wafer to sit in a non-plasma environment for a time period of at least 30 seconds; and after allowing the wafer to sit, exposing the wafer to an oxygen- or hydrogen-based plasma to remove the material.

According to various embodiments, the work piece is allowed to sit for at least about 100 seconds, at least about 150 seconds, at least about 200 seconds, or at least about 220 seconds.

In certain embodiments, at least one of the oxygen- or hydrogen-based plasma includes fluorine species; in other embodiments, neither does. The material removed from the work piece surface may be a high-dose implanted resist. In certain embodiments, the forming gas plasma is remotely generated. In certain embodiments, a protective film forms on exposed silicon portions of the workpiece after exposure to the forming gas plasma. The protective film may be a $Si_xN_y$ film.

Another aspect of the invention relates to an apparatus for removing material from a work piece surface including a reaction chamber including a plasma source, a showerhead positioned downstream of the plasma source, and a work piece support downstream of the showerhead, said work piece support comprising a pedestal and temperature-controlling mechanism to control a temperature of a work piece supported on the work piece support; and a controller for executing a set of instructions, said set of instruction including instructions for exposing the work piece to a plasma generated from forming gas; after exposing the work piece to the forming gas plasma, allowing the wafer to sit in a non-plasma environment for a time period of at least 30 seconds; and after allowing the wafer to sit, exposing the wafer to an oxygen- or hydrogen-based plasma to remove the material.

These and other features and advantages of the present invention will be described in more detail below with reference to the associated drawings.

BRIEF DESCRIPTION OF THE DRAWINGS

FIGS. 1A-1D depict various stages of semiconductor device fabrication before and after ion implantation and stripping operations.

DETAILED DESCRIPTION OF THE PREFERRED EMBODIMENTS

Introduction

Figure 2:
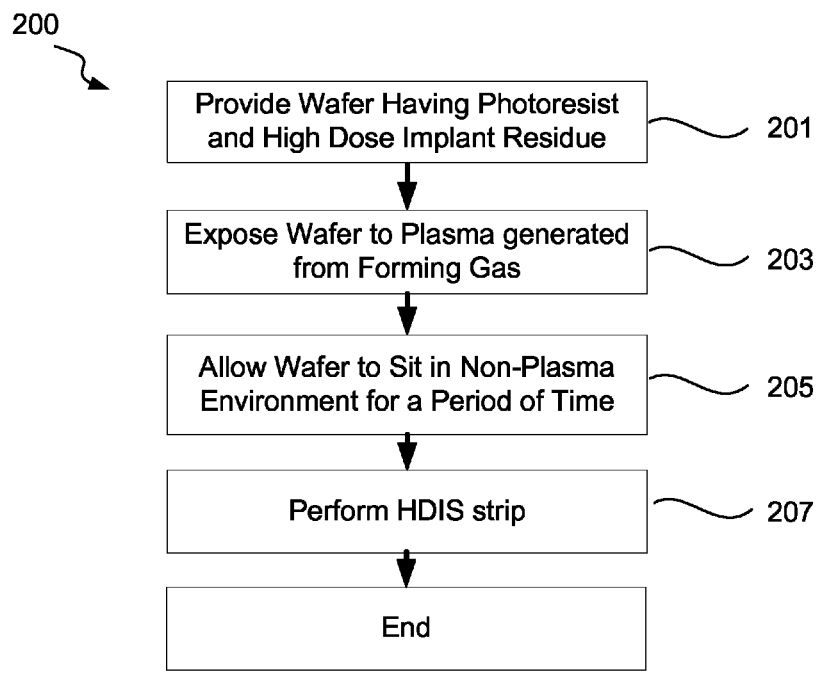
FIG. 2 is a process flow diagram illustrating operations in accordance with certain embodiments of the present invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "work piece", "semiconductor wafer", "wafer" and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as displays, printed circuit boards, and the like.

Photoresist is a light sensitive material used in certain fabrication processes to form a patterned coating on a work piece, e.g., a semiconductor wafer, during processing. After exposing the photoresist coated surface to a pattern of high energy radiation, a portion of the photoresist is removed to reveal the surface below, leaving the rest of the surface protected. Semiconductor processes such as etching, depositing, and ion implanting are performed on the uncovered surface and the remaining photoresist. After performing one or more semiconductor processes, the remaining photoresist is removed in a strip operation.

During ion implantation, dopant ions, e.g., ions of boron, boron difluoride, indium, gallium, thallium, phosphorous, arsenic, antimony, bismuth, or germanium, are accelerated toward a work piece target. The ions implant in exposed regions of the work piece as well as in the remaining photoresist surface. The process may form well regions (source/drain) and lightly doped drain (LDD) and doubled diffused drain (DDD) regions. The ion implant impregnates the resist with the implant species and depletes the surface of hydrogen. The outer layer or crust of the resist forms a carbonized layer that may be much denser than the underlying bulk resist layer. These two layers have different thermal expansion rates and react to stripping processes at different rates.

The difference between the outer layer and bulk layer is quite pronounced in post high-dose ion implant resist. In high-dose implantation, the ion dose may be greater than $1\times10^{15}$ ions/cm2 and the energy may be from 10 Kev to greater than 100 keV. Traditional high dose implantation strip (HDIS) processes employ oxygen chemistries where monatomic oxygen plasma is formed away from the process chamber and then directed at the work piece surface. The reactive oxygen combines with the photoresist to form gaseous by-products which is removed with a vacuum pump. For HDIS, additional gases are needed to remove the implanted dopants with oxygen.

Primary HDIS considerations include strip rate, amount of residue, and film loss of the exposed and underlying film layer. Residues are commonly found on the substrate surface after HDIS and stripping. They may result from sputtering during the high-energy implant, incomplete removal of crust, and/or oxidation of implant atoms in the resist. After stripping, the surface should be residue free or substantially residue free to ensure high yield and eliminate the need for additional residue removal processing. Residues may be removed by overstripping, i.e., a continuation of the strip process past the point nominally required to remove all photoresist. Unfortunately, in conventional HDIS operations, overstripping sometimes removes some of the underlying functional device structure. At the device layer, even very little silicon loss from the transistor source/drain regions may adversely affect device performance and yield, especially for ultra shallow junction devices fabricated at the <32 nm design rule or below.

As mentioned previously, the methods and apparatus of the invention may be used to efficiently and effectively to remove photoresist materials after high-dose ion implantation. The invention is not limited to high-dose implant strip (HDIS). The invention is also not limited to any particular category of dopants implanted. For instance, described methods and apparatus may be effectively used with stripping after medium or low dose implant. Although specific dopant ions such as boron, arsenic, and phosphorous are discussed, the described methods and apparatus may be effectively used to strip resist impregnated with other dopants, such as nitrogen, oxygen, carbon, germanium, and aluminum.

The methods and apparatus of the present invention use passivation plasmas that are produced from forming gas. The methods and apparatus also use photoresist stripping and ion removal plasmas that are generated from plasmas gases that contain oxygen and/or hydrogen. In certain embodiments, the gases also contain a fluorine-containing gas, a weak oxidizing agent and one or more additional components. One skilled in the art will recognize that the actual species present in the plasma may be a mixture of different ions, radicals, and molecules derived from the particular gases used to generate the plasmas described herein. For example, it is noted that other species may be present in the reaction chamber, such as small hydrocarbons, carbon dioxide, water vapor and other volatile components as the plasma reacts with and breaks down the organic photoresist and other residues. One of skill in the art will also recognize that the initial gas/gases introduced into the plasma is/are often different from the gas/gases that exist in the plasma as well as the gas/gases contact the work piece surface during strip.

FIG. 1A to 1D depicts various stages of semiconductor fabrication before and after ion implantation and stripping operations. FIG. 1A shows a semiconductor substrate 101 coated with photoresist material 103. The substrate 101 may include one or more layers of deposited film, e.g., oxide film, silicide contact, and/or polysilicon film, or may be a bare silicon substrate, including for example a silicon-on-insulator type substrate. Initially, the photoresist material coats the entire substrate surface. The photoresist is then exposed to patterned radiation generated through a mask and developed to remove a portion of the material, e.g., the opening 104 shown in FIG. 1A between the remaining photoresist materials 103.

The substrate is then exposed to an ion implant process. During ion implant, the surface of the work piece or wafer is implanted with dopant ions. The process may be, for example, a plasma-immersion ion implantation (PIII) or ion beam implantation. The ions bombard the substrate surface, including the exposed silicon layer 101 and the photoresist 103. With high energy ion implantation, small amounts of the underlying material 107 may be sputtered to the photoresist sidewalls. See FIG. 1B. This material may include some of the implant species, other material in the plasma or ion beam, and by-products of the implantation. They include silicon, aluminum, carbon, fluorine, titanium, other contact materials such as cobalt, and oxygen in both elemental and compound form. The actual species depend on the composition of the substrate before ion implant, the photoresist, and the implanted species.

At the exposed silicon layer 101, a doped region 109 is created. The ion energy or intensity of the bombardment determines the depth or thickness of the doped region. The density of the ion flux determines the extent of doping.

The ions also impregnate the photoresist surface creating a crust layer 105. The crust layer 105 may be carbonized and highly cross-linked polymer chains. The crust is usually depleted of hydrogen and impregnated with the implant species. The crust layer 105 is denser than the bulk resist layer 103. The relative density depends on the ion flux while the thickness of the crust layer depends on the ion energy.

This crust layer 105 is harder to strip than the bulk photoresist 103 below. Removal rates of the crust layer may be 50% or 75% slower than the underlying bulk Enhanced Passivation process to protect Silicon prior to High Dose Implant Enhanced Passivation process to protect Silicon prior to High Dose Implant photoresist. The bulk photoresist contains relatively high levels of chemically bonded nitrogen and some of its original casting solvent. At elevated wafer temperature, e.g., above 150 to above 200° C., the bulk resist can outgas and expand relative to the crust layer. The entire photoresist can then "pop" as the underlying bulk photoresist builds up pressure under the crust. Photoresist popping is a source of particles and process defects because the residues are especially hard to clean from the wafer surface and chamber internal parts. With high-dose ion implantation, the density difference between the crust and underlying bulk photoresist layer is even higher. The crust may also be thicker.

FIG. 1C shows the substrate after a strip that fails to completely remove the photoresist 103 and the sidewall sputter residue 107. The sidewall sputter residue 107 may include particles that do not form a volatile compound under conventional strip chemistries. These particles may remain after a conventional strip operation. The residue may also include oxides of implanted species formed with the reactive oxygen used in oxygen-based strip chemistries, such as boron oxide and arsenic oxide. Portions of the crust 105 may also remain on the substrate. Crust sidewalls and corners at the bottom of photoresist vias may be hard to strip because of geometries. These residue particles may be removed by overstripping in some cases, using fluorinated chemistry, or wet cleaning the wafer.

Silicon loss is a function of resist thickness, crust thickness, and percent overstrip. Longer and more aggressive stripping to remove thicker resist can also remove more silicon. For resist with thicker crust, the difference between the crust layer and bulk resist layer is even more pronounced. The thicker crust sidewalls and corners are even harder to strip. Thus, strip processes designed to remove thick crust also tends to remove more silicon. Overstrip may be used to address resist uniformity and geometries in addition to residue removal. Overstrip is a continuation of the strip process past the point nominally required to remove all photoresist. If the photoresist is totally removed in some areas of the wafer but not others, continuation of the strip process would cause additional material, typically silicon and silicon oxide, to be removed from areas that are already stripped.

FIG. 1D shows the substrate after all residue has been removed. According to various embodiments, the residue is removed without additional silicon loss or oxidation and with minimum delay. In certain embodiments, the strip process leaves no residue and thus reduces the number of process steps.

Provided herein are methods to reduce silicon loss for high dose implant strip (HDIS) processes, although as noted above, the methods may be effectively used with stripping after medium or low dose implant or other photoresist stripping processes. The methods described herein provide a passivation layer to prevent silicon loss prior to stripping and are not limited to a particular stripping chemistry.

FIG. 2 is a process flow diagram 200 illustrating operations in a method according to certain embodiments. First, a wafer having photoresist and implant residue material is provided in an operation 201. The wafer may be provided to a chamber capable of containing a plasma. Although not depicted, the wafer is optionally pre-heated (prior to, during, or after operation 201) to a set temperature low enough to prevent popping, but high enough to provide energy for formation of a passivation layer and an acceptable etch rate in further operations. The wafer is then exposed to a plasma generated from forming gas an operation 203. The forming gas comprises hydrogen and an inert dilutant, such as, for example, nitrogen, helium, or the like, or a combination thereof. In an exemplary embodiment of the invention, the forming gas is about 0.5 to about 10 molar percent (%) hydrogen. In a particular embodiment of the invention, the forming gas is about 3 to about 6% hydrogen, e.g., 4% hydrogen. In certain embodiments, pure nitrogen gas with essentially no hydrogen is used. It has been found that pure nitrogen can provide as similar passivation effect as forming gas.

The wafer is exposed to the forming gas plasma for a period of time, e.g., on the order of about 10 to 90 seconds, e.g., about 20 to 40 seconds. In many embodiments, the plasma is a remotely-generated plasma, though it may be an in-situ plasma. In certain embodiments, the plasma is generated from a gas consisting essentially of forming gas. In other embodiments, other species may be added. In certain embodiments, substantially no oxygen or fluorine is present in the gases inlet to the plasma generator.

Then in an operation 205, the plasma is extinguished and the wafer sits for a period of time. In certain embodiments, the wafer is allowed to cool during this operation, for example to about 35 C. Without being bound by a particular theory, it is believed that a protective surface forms on the exposed silicon to slow prevent oxidation or etching from subsequent oxygen-based or hydrogen-based stripping chemistries that may include fluorine species. The protective surface may be a $Si_xN_y$ film.

Figure 3:
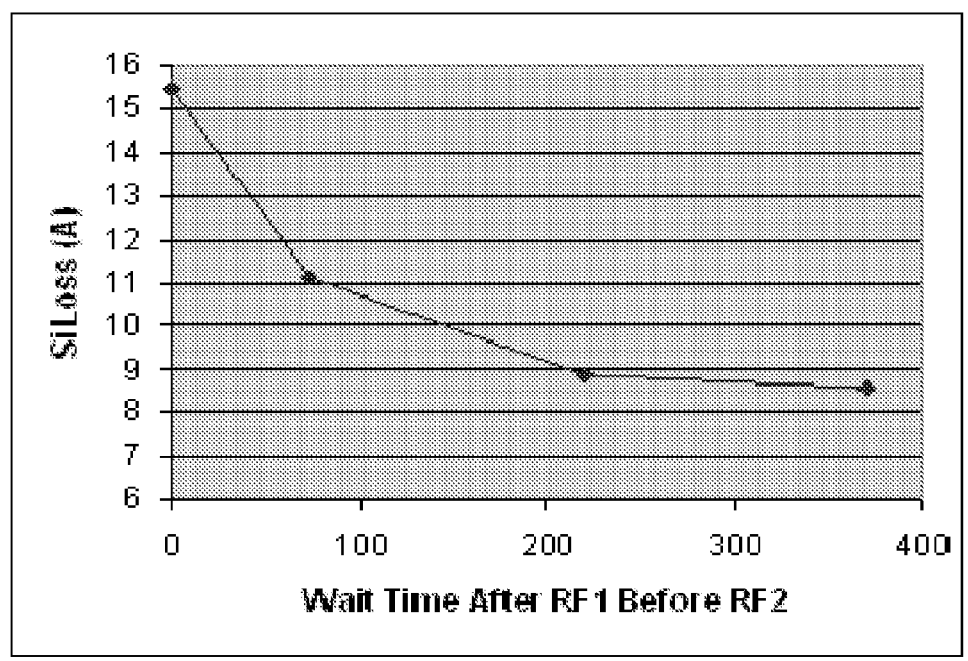
FIG. 3 is a graph showing silicon loss as a function of post-passivation wait time.

It was unexpectedly found that the wait time between operation 203 and the subsequent stripping operations is critical to reducing silicon loss. FIG. 3 is a graph showing silicon loss (Angstroms) as a function of wait time (seconds) between exposure to the forming gas plasma, and a subsequent stripping process using a hydrogen-based chemistry containing fluorine. The silicon loss decreases sharply as the wait time increases, eventually leveling off around 220 seconds. According to various embodiments, the wait time is at least about 30 seconds, at least about 60 seconds, at least about 100 seconds, at least about 120 seconds, at least about 140 seconds, at least about 160 seconds, at least about 180 seconds, at least about 200 seconds, at least about 220 seconds, at least about 240, at least about 260 seconds, or at least about 280 seconds. The effect observed in FIG. 3 is unexpected as the chemical kinetics of the reaction to form a $Si_xN_y$ film would be expected to be much faster.

Once the waiting period is finished, a stripping process is performed in an operation 207. The stripping process may use one or more oxygen-based or hydrogen-based plasmas. In certain embodiments, the stripping chemistry additionally contains fluorine species in one or more operations. Fluorine compounds that may be fed to the plasma generator to generate such species include nitrogen trifluoride (NF3), sulfur hexafluoride (SF6), hexafluoroethane (C2F6), tetrafluoromethane (CF4), trifluoromethane (CHF3), difluoromethane (CH2F2), octofluoropropane (C3F8), octofluorocyclobutane (C4F8), octofluoro[1-]butane (C4F8), octofluoro[2-]butane (C4F8), octofluoroisobutylene (C4F8), fluorine (F2), and the like.

While the methods described herein are not limited to any particular strip chemistries, examples plasmas to remove photoresist and HDI residue include plasmas generated from the following:
O2/NF3
O2/CF4
O2/N2
H2/CO2/NF3
H2/CO2/CF4
H2/CO2/NF3/CF4
H2/CO2
H2/N2

In many embodiments, multiple operations having different chemistries are performed to fully remove the photoresist and residue. In certain embodiments, forming gas is added to one or more of these HDI strip operations. For example, in certain embodiments, forming gas is added to all non-fluorine containing plasma operations. It has been found that using forming gas or pure nitrogen in the fluorine-containing stations can adversely affect silicon loss. Without being bound by a particular theory, it is believed that this may be due to nitrogen in the forming gas facilitating the disassociation of the NF3, releasing more F— ions. Typically, no significant wait time is imposed after these operations, though in certain embodiments, it may be. Examples are:

O2/FG with forming gas supplying about 14-25% by volume;

H2/CO2/FG with forming gas supplying about 40-60% by volume;

It should be noted that the passivation process described in operations 203 and 205 may be performed or repeated at other stages in the process, e.g., between one or more strip operations. In certain embodiments, only operation 203 is inserted between these operations.

Plasma Generation

Various types of plasma sources may be used in accordance with the invention, including RF, DC, and microwave based plasma sources. In a preferred embodiment, a downstream RF plasma source is used. Typically, the RF plasma power for a 300 mm wafer ranges between about 300 Watts to about 10 Kilowatts. In some embodiments, the RF plasma power is between about 2000 Watts and 5000 Watts, e.g., 3500 W.

Showerhead Assembly

According to various embodiments of the present invention the plasma gas is distributed to the work surface via a showerhead assembly. The showerhead assembly may be grounded or have an applied voltage to attract some charge species while not affecting the flow of neutral species to the wafer, e.g., 0-1000 watt bias. Many of the electrically charged species in the plasma recombine at the showerhead. The assembly includes the showerhead itself which may be a metal plate having holes to direct the plasma and inert gas mixture into the reaction chamber. The showerhead redistributes the active hydrogen from the plasma source over a larger area, allowing a smaller plasma source to be used. The number and arrangement of the showerhead holes may be set to optimize strip rate and strip rate uniformity. If the plasma source is centrally located over the wafer, the showerhead holes are preferably smaller and fewer in the center of the showerhead in order to push the active gases toward the outer regions. The showerhead may have at least 100 holes. Suitable showerhead include the Gamma xPR showerhead or the GxT drop-in showerhead available from Novellus Systems, Inc. of San Jose, Calif. In embodiments in which there is no showerhead assembly, the plasma enters the process chamber directly.

Process Chamber

The process chamber may be any suitable reaction chamber for the strip operation being performed. It may be one chamber of a multi-chambered apparatus or it may simply be a single chamber apparatus. The chamber may also include multiple stations where different wafers are processed simultaneously. The process chamber may be the same chamber where the implant, etch, or other resist-mediated process takes place. In other embodiments, a separate chamber is reserved for the strip. Process chamber pressure may range from about 600 mTorr to 2 Torr. In certain embodiments, the pressure ranges from about 0.9 Torr to 1.5 Torr.

The process chamber includes one or more processing stations on which strip operations are performed. In certain embodiments, the one or more processing stations includes a preheat station, at least one strip station, and an over-ash station. The wafer support is configured to support the wafer during processing. The wafer support may also transfer heat to and from the wafer during processing to adjust the wafer temperature as necessary. In certain embodiments, the wafer is supported on a plurality of minimum contacts and does not physically contact the wafer support surface plane. A spindle picks up the wafer and transfers the wafer from one station to another.

Figure 4:
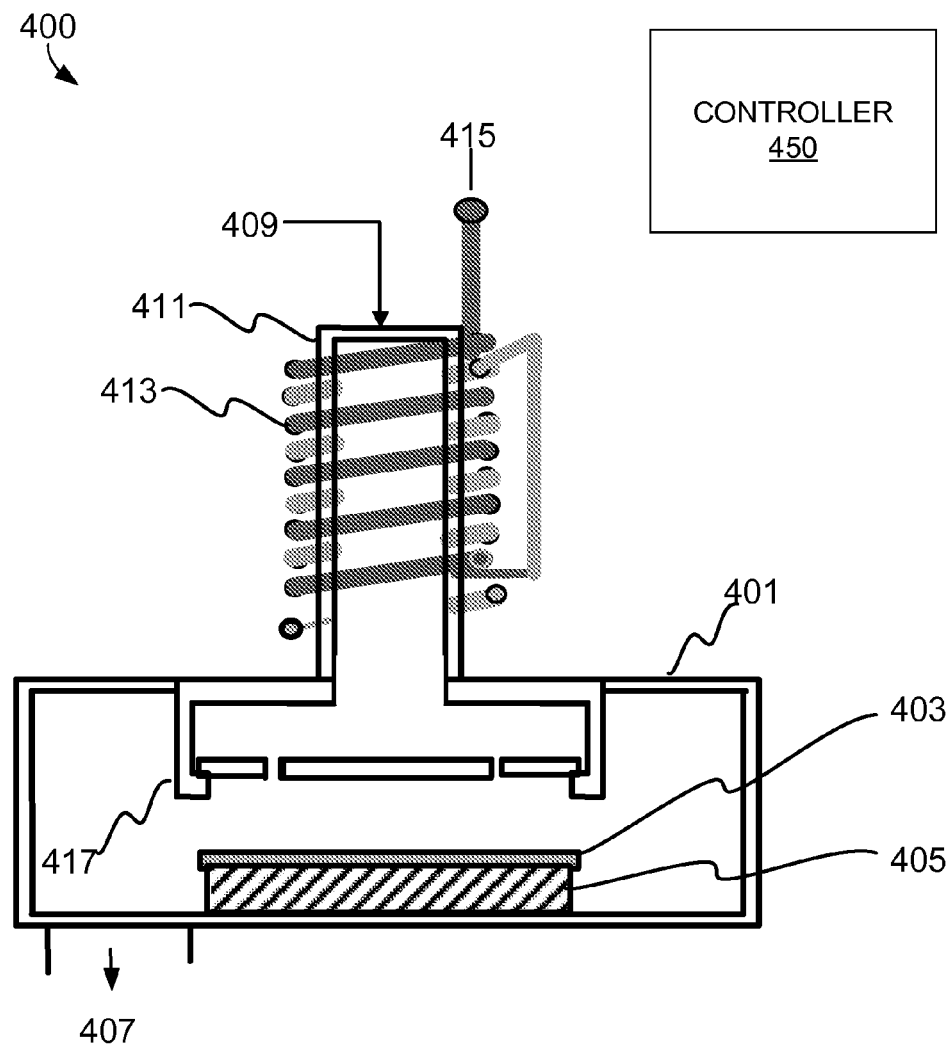
FIG. 4 is a schematic illustration showing an apparatus suitable for implementing aspects of the present invention.

FIG. 4 is a schematic illustration showing aspects of a downstream plasma apparatus 400 suitable for practicing the present invention on wafers. This apparatus may be used both for passivation and strip operations. Apparatus 400 has a plasma producing portion 411 and an exposure chamber 401 separated by a showerhead assembly 417. Inside exposure chamber 401, a wafer 403 rests on a platen (or stage) 405. Platen 405 is fitted with a heating/cooling element. In some embodiments, platen 405 is also configured for applying a bias to wafer 403. Low pressure is attained in exposure chamber 401 via vacuum pump via conduit 407. Sources of gaseous hydrogen (with or without dilution/carrier gas) and carbon dioxide (or other weak oxidizing agent) provide a flow of gas via inlet 409 into plasma producing portion 411 of the apparatus. Plasma producing portion 411 is surrounded in part by induction coils 413, which are in turn connected to a power source 415. During operation, gas mixtures are introduced into plasma producing portion 411, induction coils 413 are energized and a plasma is generated in plasma producing portion 411. Showerhead assembly 417 may have an applied voltage or be grounded directs the flow of species into exposure chamber 401. As mentioned, wafer 403 may be temperature controlled and/or a RF bias may be applied. Various configurations and geometries of the plasma source 411 and induction coils 413 may be used. For example, induction coils 413 may loop around the plasma source 411 in an interlaced pattern. In another example, the plasma source 411 may be shaped as a dome instead of a cylinder. A controller 450 may be connected to components of the process chamber, and control process gas composition, pressure, temperature and wafer indexing of the stripping operations. Machine-readable media may be coupled to the controller and contain instructions for controlling process conditions for these operations.

Suitable plasma chambers and systems include the Gamma 2100, 2130 I2CP (Interlaced Inductively Coupled Plasma), G400, and GxT offered by Novellus Systems, Inc. of San Jose, Calif. Other systems include the Fusion line from Axcelis Technologies Inc. of Rockville, Md., TERA21 from PSK Tech Inc. in Korea, and the Aspen from Mattson Technology Inc. in Fremont, Calif. Additionally, various strip chambers may be configured onto cluster tools. For example, a strip chamber may be added to a Centura cluster tool available from Applied Materials of Santa Clara, Calif.

Work Piece

In preferred embodiments, the work piece used in accordance with the methods and apparatus of the invention is a semiconductor wafer. Any size wafer may be used. Most modern wafer fabrication facilities use either 200 mm or 300 mm wafers. As disclosed above, the process and apparatus disclosed herein strips photoresist after a processing operation such as etching, ion implant, or deposition. The present invention is suitable for wafers having very small features or critical dimensions, e.g., sub 100 nm, at 65 nm, or at or less than 45 nm. The low silicon loss feature of the HDIS as disclosed is particularly suitable for very shallow junctions of advanced logic devices. The present invention is also specifically suitable for wafers undergoing front end of the line (FEOL) ion implantation, especially high-dose ion implantation.

The plasma-activated species reacts with the photoresist and sputter residue on the wafer. At the wafer, the reactive gas may include a number of plasma activated species, radicals, charged species, and gas by-products. For hydrogen-based plasmas, the volume concentration of various hydrogen species may be about 20-80% of the gas at the wafer, typically over 50%. For oxygen-based plasmas, the volume concentration of various oxygen species may be about 20-80% of the gas at the wafer, typically over 50%. The volume concentration of various fluorine species may be 0.01% to about 2% or less than 1%. The volume concentration of various species from the weak oxidizing agent may be 0.05 to about 5% or about 1.2%. These species may include H2*, H2+, H+, H*, e-, OH, O*, CO, CO2, H2O, HF, F*, F—, CF, CF2, and CF3.

Process conditions may vary depending upon the wafer size. In some embodiments of the invention, it is desired to keep the work piece at a particular temperature during the application of plasmas to its surface. Wafer temperatures can range between about 110 degrees and about 500 degrees Celsius. To reduce the likelihood of photoresist popping described above, wafer temperature is preferably increased slowly until enough crust has been removed and photoresist popping ceases to be a concern. Initial station temperature may be about 110 degrees to about 260 degrees Celsius, for example, about 240 degrees Celsius. Later stations can use higher temperatures such as 285 degrees Celsius and about 350 degrees Celsius successfully with good strip rates. In certain embodiments, the temperature is lowered during NF3 spikes to reduce Si loss associated with these spikes.

EXAMPLE PROCESSES

Figure 5:
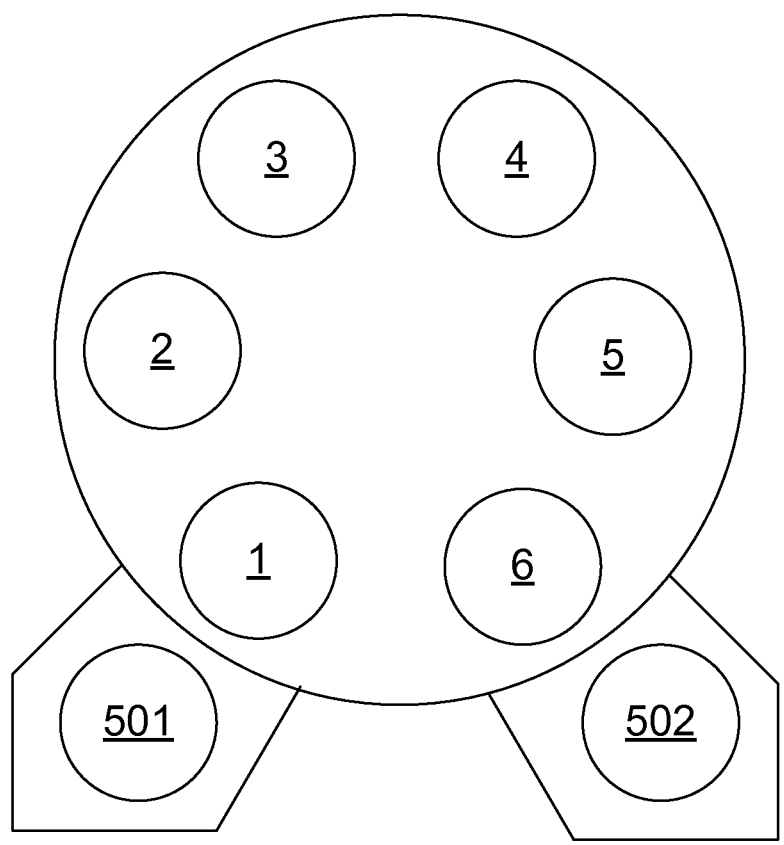
FIG. 5 shows a multi-station sequential architecture suitable for implementing aspects of the present invention.

As indicated above, in certain embodiments, a multi-station strip apparatus is employed to perform the photoresist and residue stripping processes described herein. FIG. 5 is a simplified schematic showing a top view of such an apparatus including stations 1, 2, 3, 4, 5 and 6. Wafers enter the apparatus at station 1 via chamber 501, are transferred to each station in sequence for a processing operation at that station and exit from station 6 via chamber 502 after the process is complete. The architecture permits pausing or cooling the wafer after the passivation process to protect against silicon erosion by HDIS strip chemistries.

Example Process 1

| Station | Chemistry | Time | Temperature (C.) |
|---|---|---|---|
| 1 - Preheat | No gas | 18 seconds | 240 |
| 2 - FG passivation - plasma exposure | FG | 18 seconds | 240 |
| 2 - post-passivation wait | FG (plasma off) | 220 seconds | 240 |
| 3-4 | H2/CO2/NF3 | 18 seconds per station | 285 |
| 5-6 | H2/CO2/FG | 18 seconds per station | 350 |

Example Process 2

| Station | Chemistry | Time | Temperature (C.) |
|---|---|---|---|
| 1 - FG passivation - plasma exposure | FG | 18 seconds | 240 |
| 1 - post-passivation wait | FG (plasma off) | 220 seconds | |
| 2-4 | H2/CO2/NF3 | 18 seconds per station | 285 |
| 5-6 | H2/CO2/FG | 18 seconds per station | 350 |

In another example process, a first pass on 6 stations is performed to provide the forming gas passivation, followed by pre-heat in station 1 and strip operations in stations 2-6 in a second pass. The waiting operation may take place outside the chamber, in a non-oxidative environment.

The disclosed methods and apparatus may be implemented in systems including lithography and/or patterning hardware for semiconductor fabrication. Further, the disclosed methods may be implemented in a process with lithography and/or patterning processes preceding or following the disclosed methods.

Experimental

Various experiments were conducted comparing Si loss when the forming gas passivation in station 1 preceded F-containing strip operations in stations 2-6 to Si loss when no passivation process was performed. Silicon loss was reduced by 54%-82%.

While this invention has been described in terms of a few preferred embodiments, it should not be limited to the specifics presented above. Many variations on the above-described preferred embodiments may be employed. Therefore, the invention should be broadly interpreted with reference to the following claims.

What is claimed is:

1. A method of removing photoresist from a work piece surface in a reaction chamber, the method comprising:
    exposing the work piece to a first plasma generated from forming gas or pure nitrogen, wherein photoresist is on the work piece surface during the exposure to the first plasma;
    after exposing the work piece to the first plasma, allowing the work piece to sit in a non-plasma environment for a time period of at least 30 seconds;
    and after allowing the work piece to sit, exposing the work piece to a second oxygen- or hydrogen-based plasma to remove the photoresist, wherein the first and second plasmas have different chemistries.

2. The method of claim 1, wherein the work piece is allowed to sit for at least 100 seconds.

3. The method of claim 1, wherein the work piece is allowed to sit for at least 150 seconds.

4. The method of claim 1, wherein the work piece is allowed to sit for at least 200 seconds.

5. The method of claim 1, wherein the work piece is allowed to sit for at least 220 seconds.

6. The method of claim 1, wherein the second oxygen- or hydrogen-based plasma comprises fluorine species.

7. The method of claim 1, wherein the photoresist removed from the work piece surface comprises a high-dose implanted resist.

8. The method of claim 1, wherein the first plasma is remotely generated.

9. The method of claim 1, wherein a protective film forms on exposed silicon portions of the work piece as a result of exposure to the first plasma while the work piece is allowed to sit.

10. The method of claim 9 wherein the protective film is a $Si_xN_y$ film.

11. The method of claim 1, wherein exposing the work piece is performed after a lithography operation.

12. A method of removing material from a work piece surface in a reaction chamber, the method comprising:
   exposing the work piece to a first plasma generated from forming gas or pure nitrogen in the reaction chamber, wherein the work piece has photoresist thereon;
   after exposing the work piece to the first plasma, allowing the work piece to sit in a non-plasma environment in the reaction chamber for a time period of at least 30 seconds;
   and after allowing the work piece to sit, exposing the work piece to a second oxygen- or hydrogen-based plasma to remove the photoresist, wherein the first and second plasmas have different chemistries.

13. A method of removing material from a work piece surface in a reaction chamber, the method comprising:
   exposing the work piece to a first plasma generated from forming gas or pure nitrogen, wherein the work piece has photoresist thereon;
   after exposing the work piece to the first plasma, allowing the work piece to sit in a non-plasma environment in the reaction chamber for a time period of at least 30 seconds;
   and after allowing the work piece to sit, exposing the work piece to a second oxygen- or hydrogen-based plasma to remove the photoresist, wherein the work piece is maintained in a vacuum environment during the method, and wherein the first and second plasmas have different chemistries.

* * * * *